United States Patent
Cowley et al.

(10) Patent No.: US 7,343,142 B2
(45) Date of Patent: Mar. 11, 2008

(54) TUNER

(75) Inventors: Nicholas Paul Cowley, Wiltshire (GB); Peter Coe, Wiltshire (GB)

(73) Assignee: Intel Corporation, Santa Clara, CA (US)

( * ) Notice: Subject to any disclaimer, the term of this patent is extended or adjusted under 35 U.S.C. 154(b) by 451 days.

(21) Appl. No.: 11/135,645

(22) Filed: May 24, 2005

(65) Prior Publication Data

US 2005/0272387 A1    Dec. 8, 2005

(30) Foreign Application Priority Data

Jun. 5, 2004    (GB) .................... 0412676.9

(51) Int. Cl.
*H04B 1/18*    (2006.01)
(52) U.S. Cl. .................. 455/180.3; 455/188.2; 455/260; 455/339; 455/341
(58) Field of Classification Search ............ 455/179.1, 455/180.1, 180.2, 180.3, 183.1, 183.2, 188.1, 455/188.2, 255, 257, 258–260, 341, 337, 455/334
See application file for complete search history.

(56) References Cited

U.S. PATENT DOCUMENTS 6,944,427 B2 * 9/2005 Haub et al. ................ 455/63.1
2002/0151287 A1 * 10/2002 Lindquist et al. ......... 455/183.1
2005/0048928 A1 * 3/2005 Jeon et al. .................... 455/78
2006/0019604 A1 * 1/2006 Hasarchi ...................... 455/15
2006/0246842 A1 * 11/2006 Mohindra ................. 455/63.1

FOREIGN PATENT DOCUMENTS

GB    1 594 632 A    8/1981

* cited by examiner

*Primary Examiner*—Edward F. Urban
*Assistant Examiner*—Nhan T. Le
(74) *Attorney, Agent, or Firm*—Blakely, Sokoloff, Taylor & Zafman LLP

(57) ABSTRACT

A digital terrestrial tuner has an RF input connected to a filter arrangement, whose output signal is supplied to a zero intermediate frequency frequency changer. The filter arrangement comprises a plurality of signal paths of different frequency responses. The signal paths are selectable one at a time for insertion between the tuner input and the frequency changer. At least one of the signal paths comprises a non-tracking filter which provides attenuation of out-of-band signals so as to reduce harmonic mixing caused by harmonics of the frequency changer commutating signal or by harmonics of spurious signals at lower frequencies.

26 Claims, 3 Drawing Sheets

TUNER

TECHNICAL FIELD

The present invention relates to a tuner. For example, such a tuner may be used for receiving digital terrestrial broadcasts.

BACKGROUND

Known receivers for receiving digital terrestrial transmissions are generally of the single conversion or double conversion superheterodyne type. Although both types of tuner can provide adequate performance, they have features which make it difficult or impossible to increase the degree of integration and minimise the tuner size.

In the case of single conversion tuners, in order to achieve adequate selectivity so as to provide acceptable performance in the presence of potentially interfering signals, a plurality of tracking filters are required. Such filters must be aligned, either during manufacture or by means of some form of automatic calibration during operation. Such filters occupy a substantial area and prevent "upintegration", because they cannot effectively be integrated in a multi-chip module (MCM) or by integrated circuit techniques. Also, such filters are unsuitable for implementation on a motherboard because of manufacturing problems associated with the requirement for alignment.

Double conversion tuners are more suited to board-level implementation and upintegration because they make use of broadband techniques so that no front-end tracking selectivity filters are required. However, because of the broadband nature of the front-end, it is more difficult to achieve the required dynamic range for providing acceptable performance. Also, an image filter is required at the first intermediate frequency (IF). Such a filter is typically of high Q construction and may be embodied as a surface acoustic wave (SAW) or dielectric filter.

In addition to the image or selectivity filters in both types of tuner, further intermediate frequency filtering has to be provided in order to suppress adequately immediately adjacent channels. Such a filter is typically a SAW device with a passband centred at an intermediate frequency, for example of 36 MHz in the case of UK-based digital transmissions.

GB1594632 discloses a single-conversion superheterodyne receiver for relatively low frequency signals of the type received during prospecting for hydrocarbons. The receiver has a plurality of individually selectable filter paths between an input and a frequency changer. The filter paths are selected according to the frequency decade to be received.

SUMMARY

According to the invention, there is provided a tuner comprising an input for receiving a broadband signal containing a plurality of channels for reception, a zero or near-zero intermediate frequency frequency changer for selecting any one of at least some of the channels and comprising at least one mixer and commutating signal generator, and a filter arrangement disposed between the frequency changer and the tuner input and comprising a plurality of signal paths of different frequency responses selectable one at a time for insertion between the frequency changer and the tuner input, characterised in that a first of the signal paths comprises a first non-tracking filter for providing at least a first predetermined minimum attenuation at a frequency $N_1 f_1$ or $f_2/N_1$, where $N_1$ is an integer greater than 1 and less than 4 and $f_1$ and $f_2$ are lower and upper frequency limits, respectively, of a first tuning range of the frequency changer.

The first filter may have a fixed frequency response.

$N_1$ may be equal to two. As an alternative, $N_1$ may be equal to three.

The first filter may provide at least the first minimum attenuation throughout a first frequency range above $N_1 f_1$ or below $f_2/N_1$.

The first filter may provide at least the first minimum attenuation at the frequency $N_1 f_1$ and may comprise a low pass filter. As an alternative, the first filter may provide at least the first minimum attenuation at the frequency $f_2/N_1$ and may comprise a high pass filter. The first filter may be an elliptic filter. The first filter may be fifth order filter.

A second of the signal paths may comprise a second non-tracking filter for providing at least a second predetermined minimum attenuation at a frequency $N_2 f_3$ or $f_4/N_2$, where $N_2$ is an integer greater than 1 and less than 4 and $f_3$ and $f_4$ are lower and upper frequency limits, respectively, of a second tuning range of the frequency changer.

$f_3$ may be greater than or equal to $f_2$. The first tuning range may cover a VHF band and the second tuning range may cover a UHF band.

The second filter may have a fixed frequency response.

$N_2$ may be equal to two. As an alternative, $N_2$ may be equal to three.

The second filter may provide at least the second minimum attenuation throughout a second frequency range above $N_2 f_3$ or below $f_4/N_2$.

The second filter may provide at least the second minimum attenuation at the frequency $N_2 f_3$ and may comprise a low pass filter. As an alternative, the second filter may provide at least the second minimum attenuation at the frequency $f_4/N_2$ and may comprise a high pass filter. The second filter may be an elliptic filter. The second filter may be a fifth order filter.

A third of the signal paths may be substantially non-frequency-selective.

The frequency changer may have a maximum tuning range greater than or equal to one octave. The maximum tuning range may be greater than or equal to two octaves.

The tuner may comprise an automatic gain controller upstream of a first-to-overload stage of the tuner. The first-to-overload stage may comprise at least one baseband filter downstream of the frequency changer. The automatic gain controller may be upstream of the frequency changer.

It is thus possible to provide a tuner which does not require any tracking filters. Thus, no alignment procedure is necessary, either during manufacture or during operation. The filter arrangement may be integrated in multi-chip module or integrated circuit technology. Thus, miniaturisation or upintegration may be increased to provide a compact tuner of reduced manufacturing cost. Such a tuner may be flexible in application and may allow different frequency range requirements to be accommodated.

DETAILED DESCRIPTION

Figure 1:
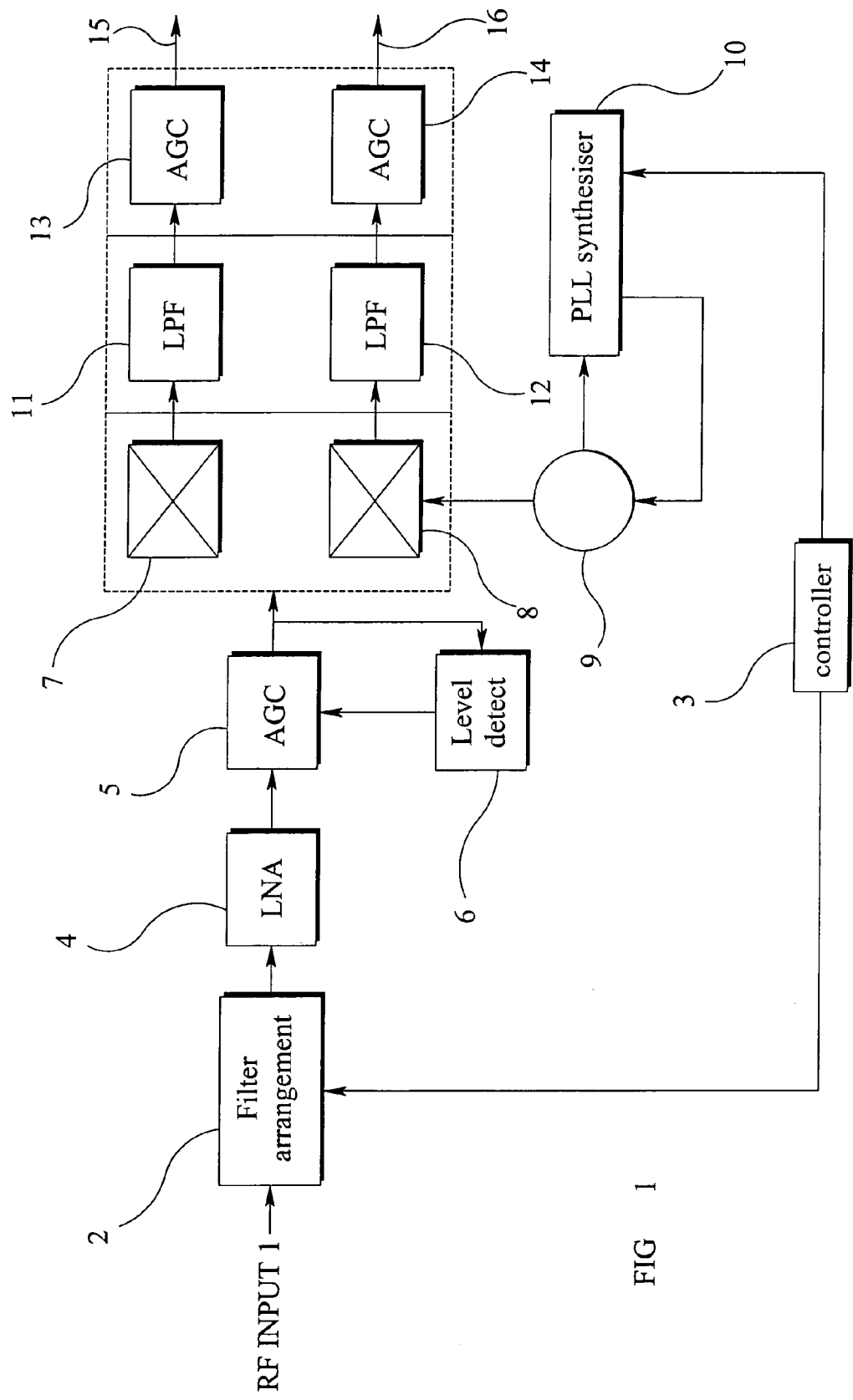
FIG. 1 is a block schematic diagram of a tuner constituting an embodiment of the invention.

The tuner shown in FIG. 1 is intended for digital terrestrial reception but may be used in other applications, for example for receiving analogue signals and for receiving signals distributed by satellite or by cable.

The tuner has a radio frequency (RF) input 1 connected to the input of a filter arrangement 2 controlled by a controller 3. The output of the filter arrangement 2 is connected to the input of a low noise amplifier (LNA) 4. The output of the LNA 4 is connected to an automatic gain controller (AGC) 5 provided with a level detect circuit 6. The output of the AGC 5 is connected to mixers 7 and 8 for converting a channel selected for reception to zero intermediate frequency or baseband. The mixers receive commutating signals from a commutating signal generator 9 controlled by a phase locked loop (PLL) synthesiser 10. The generator 9 comprises a local oscillator operating at a harmonic of the desired commutating signal frequency together with quadrature generation circuitry for supplying the commutating signals in quatrature to the mixers 7 and 8. The synthesiser 10 is also controlled by the controller 3.

The in-phase (I) and quadrature (Q) baseband signals from the mixers 7 and 8, respectively, are supplied to low pass filters (LPF) 11 and 12, which may be of substantially identical characteristic and which attenuate unwanted signals while having minimum or acceptably little effect on the desired channel selected for reception. The filters 11 and 12 are aligned by a system controller, for example forming part of the controller 3, and may have their bandwidths aligned independently of each other or "in parallel". The outputs of the filters 11 and 12 are connected to the inputs of automatic gain control amplifiers 13 and 14, respectively. The outputs of the amplifiers 13 and 14 form outputs 15 and 16, respectively, of the tuner for supplying the I and Q baseband signals to a demodulator arrangement (not shown), which controls the gain of the amplifiers 13 and 14 independently or in parallel.

Figure 2:
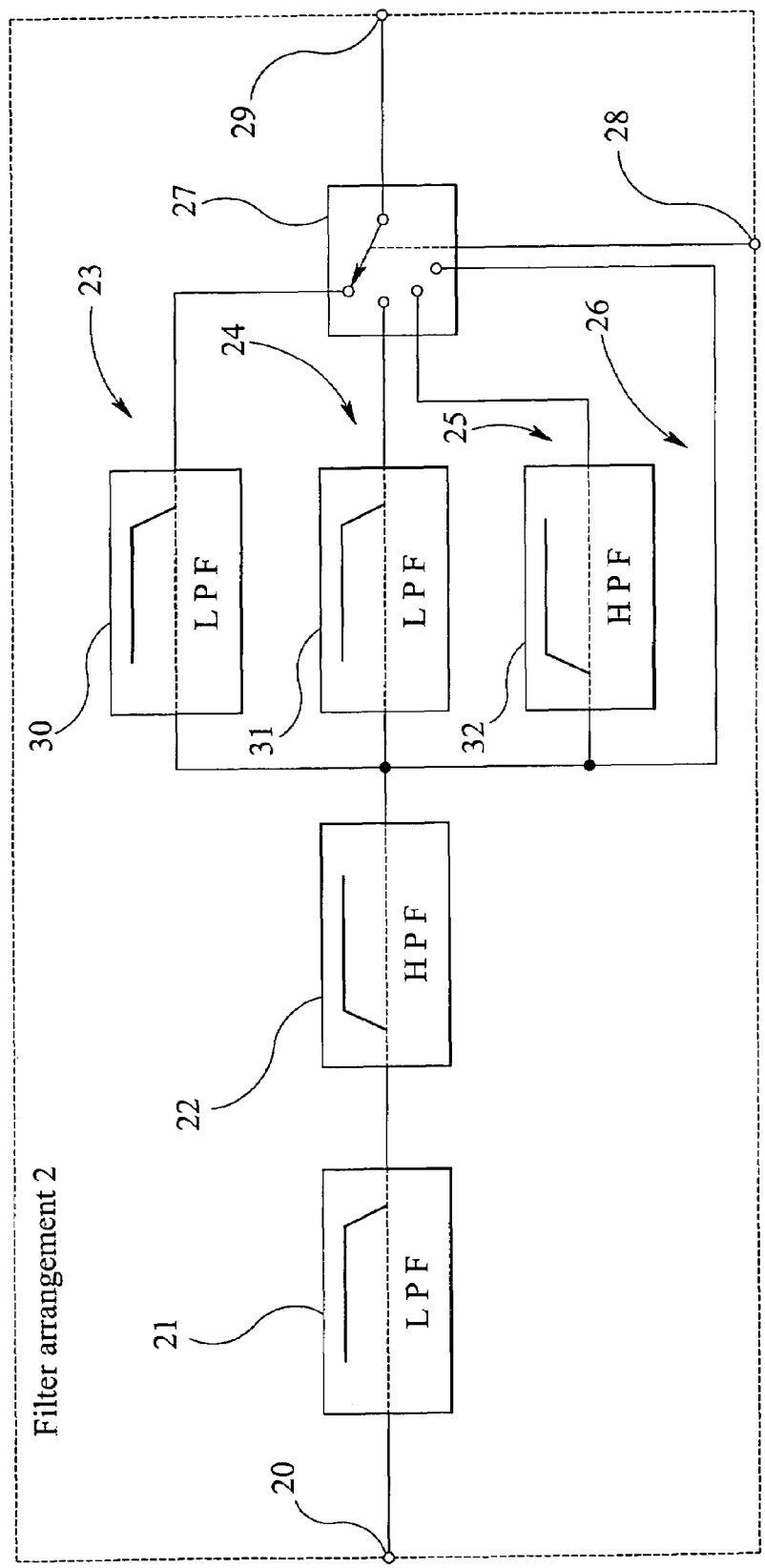
FIG. 2 is a block schematic diagram of a filter arrangement of the tuner of FIG. 1.

The filter arrangement 2 is shown in more detail in FIG. 2 and comprises an input 20 connected to optional series-connected high pass and low pass filters (LPF, HPF) 21 and 22. When present, the filters 21 and 22 act as band-limiting filters for attenuating energy outside the reception band for which the tuner is intended or of which it is capable. As alternatives depending on the application, neither of the filters 21 and 22 may be present, only one of the filters may be present, or the filters may be replaced by a bandpass filter.

The output of the series-connected filters 21 and 22 is supplied to four signal paths indicated at 23 to 26. The signal paths are connected to an electronic switch or multiplexer 27 having a control input connected to an input 28 of the filter arrangement 2 for receiving control signals from the controller 3. The output of the switch 27 is connected to an output 29 of the filter arrangement.

The signal paths 23 to 25 comprise non-tracking fixed bandwidth filters 30 to 32, respectively. The filters may, for example, be of elliptic type and of fifth order. The filters 30 and 31 are low pass filters having different cut-off or turnover frequencies whereas the filter 32 is a high pass filter. The signal path 26 is a non-frequency-selective signal path and so does not substantially alter the frequency spectrum of signals passing through this path.

Although four signal paths 23 to 26 are shown in this embodiment, the number and types of signal paths may be selected in accordance with any tuner application. The characteristics, such as the cut-off frequencies and passband and stopband characteristics (attenuation, ripple), are selected so as to remove or sufficiently reduce the effects of harmonic mixing and the non-frequency-selective signal path 26 is provided for frequency ranges of operation of the tuner where harmonic mixing is not a problem.

Harmonic mixing is an effect whereby harmonics of the commutating signal frequency covert spurious input signals to the frequency of the channel selected for reception or whereby non-linear harmonics of a spurious input signal are at the frequency of the desired channel. The spurious inputs are then converted by the fundamental of the commutating signal, together with the desired channel, to baseband. The spurious signals thus lie within the frequency range of the desired channel and cannot be removed by filtering following frequency conversion.

For example, when a desired channel is nominally at 200 MHz, the commutating signal frequency supplied to the mixers 7 and 8 by the generator 9 is also at 200 MHz so as to perform the zero intermediate frequency conversion. However, harmonics of the commutating signal frequency are also present at at least some frequencies (N×200) MHz, where N is an integer greater than 1, so that any spurious signals lying at such harmonic frequencies are also converted to the zero intermediate frequency.

Similarly, if a desired channel has a nominal frequency of 900 MHz, then spurious signals with frequencies at (900/N) MHz may generate harmonic distortion products which are also at 900 MHz and so will be converted to the zero intermediate frequency.

In a typical example, the tuner shown in FIGS. 1 and 2 may be used for receiving digital terrestrial broadcasts (DVB-T) which, in the UK, are broadcast in the UHF band covering approximately 470 to approximately 860 MHz. Harmonics of the commutating signal lie at frequencies where there may be no spurious signals to cause interference by harmonic mixing, in which case low pass filtering is not required. However, in other countries, the VHF band 3 from approximately 170 to approximately 230 MHz is used and signals in this band may generate harmonics within the UHF band. Thus, if harmonic mixing from this mechanism is a problem, then a high pass filter such as 32 may be switched into the signal path of the filter arrangement 2 by the controller. The filter 32 may, for example, have a characteristic such that the UHF band is passed with acceptably low attenuation and ripple whereas the VHF band 3 is attenuated by at least 40 dB so that the effects of harmonic mixing are reduced to an acceptable level.

Conversely, when it is desired to receive the VHF band 3, a low pass filter such as 30 is switched into the signal path of the filter arrangement 2 by the controller so as to avoid unacceptable harmonic mixing with harmonics of the commutating signal. The characteristics of the filter 30 are then chosen in accordance with these requirements and in accordance with whether the first "overtone" produced by the generator 9 is the second or third harmonic. For example, where the first overtone is the third harmonic, the filter 30 has a cut-off frequency and characteristic such that all signals above 505 MHz are attenuated by at least 48 dB.

The AGC 5 is provided so as to delay the onset of overload in the first stage of the tuner which is likely to overload. In the embodiment illustrated in FIG. 1, the low pass filters 11 and 12 are the first to overload so that the AGC 5 is provided upstream of the filters. Because the mixers 7 and 8 have fixed gain, so that the signal level at the input of the level detect circuit 6 corresponding to the overload points of the filters 11 and 12 can be determined, the level detection and the AGC are provided upstream of the mixers 7 and 8.

In order to provide acceptable performance, the signal to "noise plus intermodulation" ratio has to be maximised or at least kept at a level sufficient for acceptable reception. The gain provided by the LNA 4 effectively overcomes noise, to which the major contribution is at the input stage of the tuner. The gain of the AGC 5 is controlled such that intermodulation does not become a problem and acceptable reception can be achieved. Level detection for controlling gain is performed upstream of the filters 11 and 12 in order to achieve this. The control function is thus chosen so as to give the maximum possible gain, so as to minimise noise, without giving an unacceptable intermodulation performance.

Figure 3:
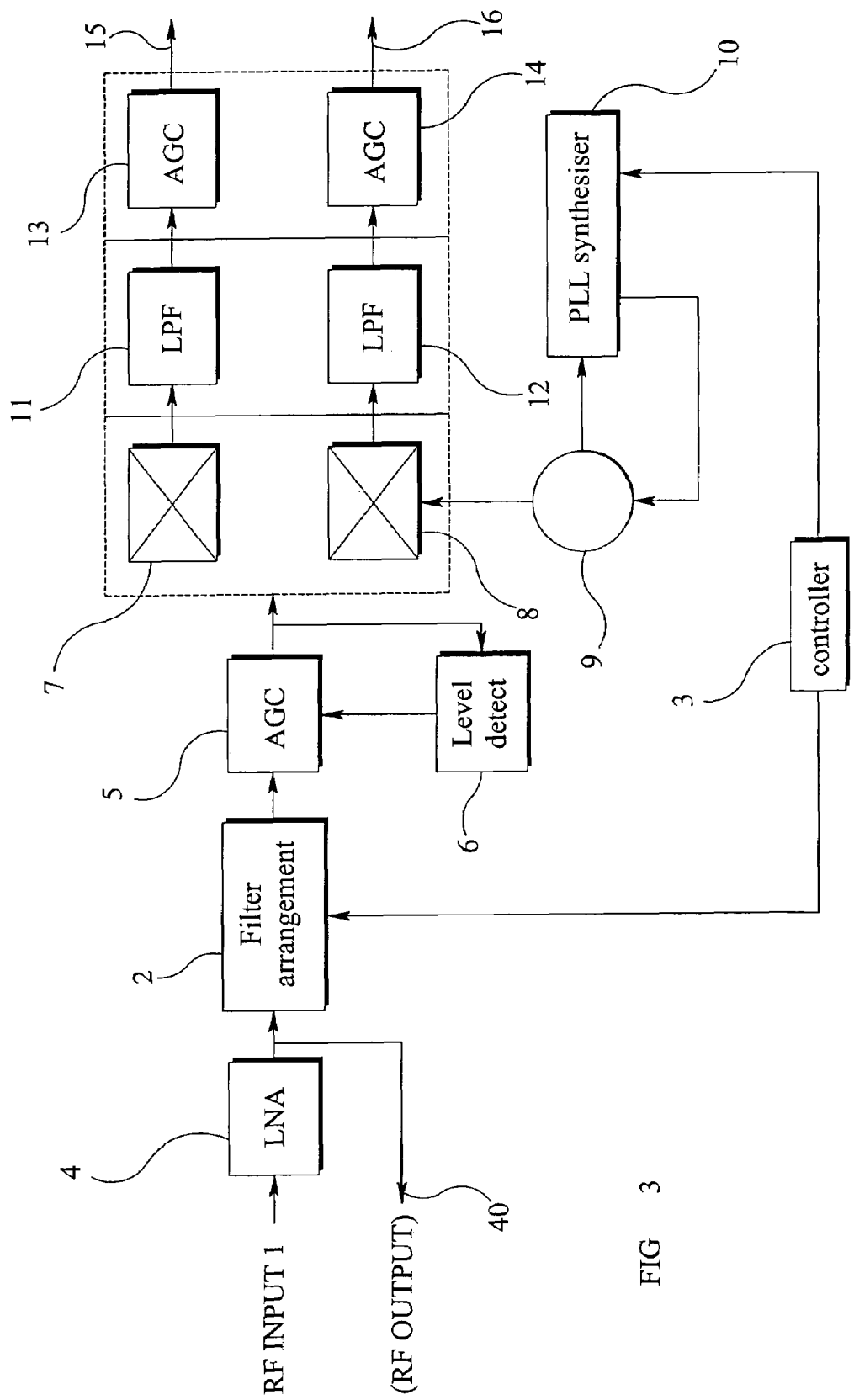
FIG. 3 is a block schematic diagram of a tuner constituting another embodiment of the invention.

The tuner shown in FIG. 3 differs from that shown in FIG. 1 in that the LNA 4 is disposed upstream of the filter arrangement 2 and supplies an RF output signal to an RF output 40. An advantage of this arrangement is that, because there is no filtering upstream of the LNA 4, there is no insertion loss associated with filtering before the first gain stage of the tuner so that a lower noise figure can be achieved. However, the LNA 4 may be required to have higher signal handling capability because the input signal level is not reduced by the filter arrangement 2. The position of the LNA 4 in FIG. 3 makes it simpler to provide band-switching between the different signal paths of the filter arrangement 2 and allows the RF "bypass" output 40 to be provided.

What is claimed is:

1. A tuner comprising: an input for receiving a broadband signal containing a plurality of channels for reception; one of a zero intermediate frequency frequency changer and a near-zero intermediate frequency frequency changer for selecting any one of at least some of said channels and comprising at least one mixer and commutating signal generator, said frequency changer having a first tuning range with an upper frequency limit $f_2$ and a lower frequency limit $f_1$; and a filter arrangement disposed between said frequency changer and said tuner input and comprising a plurality of signal paths of different frequency responses selectable one at a time for insertion between said frequency changer and said tuner input, a first of said signal paths comprising a first non-tracking filter for providing at least a first predetermined minimum attenuation at a frequency which is one of $N_1 f_1$ and $f_2/N_1$, where $N_1$ is an integer greater than one and less than 4.

2. A tuner as claimed in claim 1, in which said first filter has a fixed frequency response.

3. A tuner as claimed in claim 1, in which $N_1$ is equal to two.

4. A tuner as claimed in claim 1, in which $N_1$ is equal to three.

5. A tuner as claimed in claim 1, in which said first filter provides at least said first minimum attenuation throughout a first frequency range which is one of above $N_1 f_1$ and below $f_2/N_1$.

6. A tuner as claimed in claim 1, in which said first filter provides at least said first minimum attenuation at said frequency $N_1 f_1$ and comprises a low pass filter.

7. A tuner as claimed in claim 1, in which said first filter provides at least said first minimum attenuation at said frequency $f_2/N_1$ and comprises a high pass filter.

8. A tuner as claimed in claim 1, in which said first filter is an elliptic filter.

9. A tuner as claimed in claim 8, in which said first filter is a fifth order filter.

10. A tuner as claimed in claim 1, in which said second frequency changer has a second tuning range with a lower frequency limit $f_3$ and an upper frequency limit $f_4$ and in which a second of said signal paths comprises a second non-tracking filter for providing at least a second predetermined minimum attenuation at a frequency which is one of $N_2 f_3$ and $f_4/N_2$, where $N_2$ is an integer greater than one and less than 4.

11. A tuner as claimed in claim 10, in which $f_3$ is greater than or equal to $f_2$.

12. A tuner as claimed in claim 11, in which said first tuning range covers a VHF band and said second tuning range covers a UHF band.

13. A tuner as claimed in claim 10, in which said second filter has a fixed frequency response.

14. A tuner as claimed in claim 10, in which $N_2$ is equal to two.

15. A tuner as claimed in claims 10, in which $N_2$ is equal to three.

16. A tuner as claimed in claim 10, in which said second filter provides at least said second minimum attenuation throughout a second frequency range which is one of above $N_2 f_3$ and below $f_4/N_2$.

17. A tuner as claimed in claim 10, in which said second filter provides at least said second minimum attenuation at said frequency $N_2 f_3$ and comprises a low pass filter.

18. A tuner as claimed in claim 10, in which said second filter provides at least said second minimum attenuation at said frequency $f_4/N_2$ and comprises a high pass filter.

19. A tuner as claimed in claim 10, in which said second filter is an elliptic filter.

20. A tuner as claimed in claim 19, in which said second filter is a fifth order filter.

21. A tuner as claimed in claim 1, in which a third of said signal paths is substantially non-frequency-selective.

22. A tuner as claimed in claim 1, in which said frequency changer has a maximum tuning range greater than or equal to one octave.

23. A tuner as claimed in claim 22, in which said maximum tuning range is greater than or equal to two octaves.

24. A tuner as claimed in claim 1, comprising a first-to-overload stage and an automatic gain controller upstream of said first-to-overload stage.

25. A tuner as claimed in claim 24, in which said first-to-overload stage comprises at least one baseband filter downstream of said frequency changer.

26. A tuner as claimed in claim 25, in which said automatic gain controller is upstream of said frequency changer.

* * * * *